United States Patent [19]
Ovshinsky et al.

[11] Patent Number: 5,912,839
[45] Date of Patent: Jun. 15, 1999

[54] UNIVERSAL MEMORY ELEMENT AND METHOD OF PROGRAMMING SAME

[75] Inventors: Stanford R. Ovshinsky, Bloomfield Hills; Boil Pashmakov, Troy, both of Mich.

[73] Assignee: Energy Conversion Devices, Inc., Troy, Mich.

[21] Appl. No.: 09/102,887

[22] Filed: Jun. 23, 1998

[51] Int. Cl.$^6$ .................................................. G11C 11/00
[52] U.S. Cl. ..................................... 365/185.03; 365/163
[58] Field of Search ............................... 365/185.03, 163, 365/185.12; 257/3, 4

[56] References Cited

U.S. PATENT DOCUMENTS 5,166,901  11/1992  Shaw et al. ............................. 365/163

Primary Examiner—David Nelms
Assistant Examiner—David Lam
Attorney, Agent, or Firm—Philip H. Schlazer; Marvin S. Siskind; David W. Schumaker

[57] ABSTRACT

Method of programming Ovonic memory multistate-digital multibit memory elements, and use thereof for neural networks and data storage. The device is programmed by applying an energy pulse which is insufficient to switch the memory element from said high resistance state to said low resistance state, but sufficient to modify said memory material such that accumulation of additional energy pulses causes the memory element to switch from said high resistance state to said low resistance state.

45 Claims, 5 Drawing Sheets

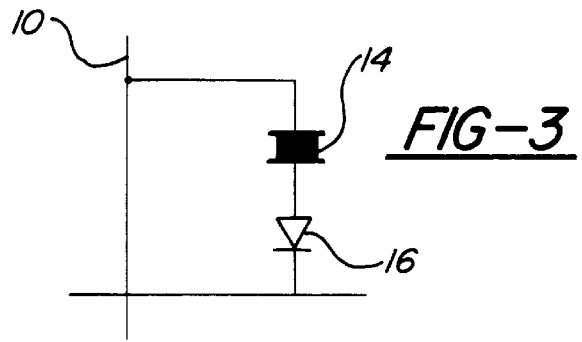
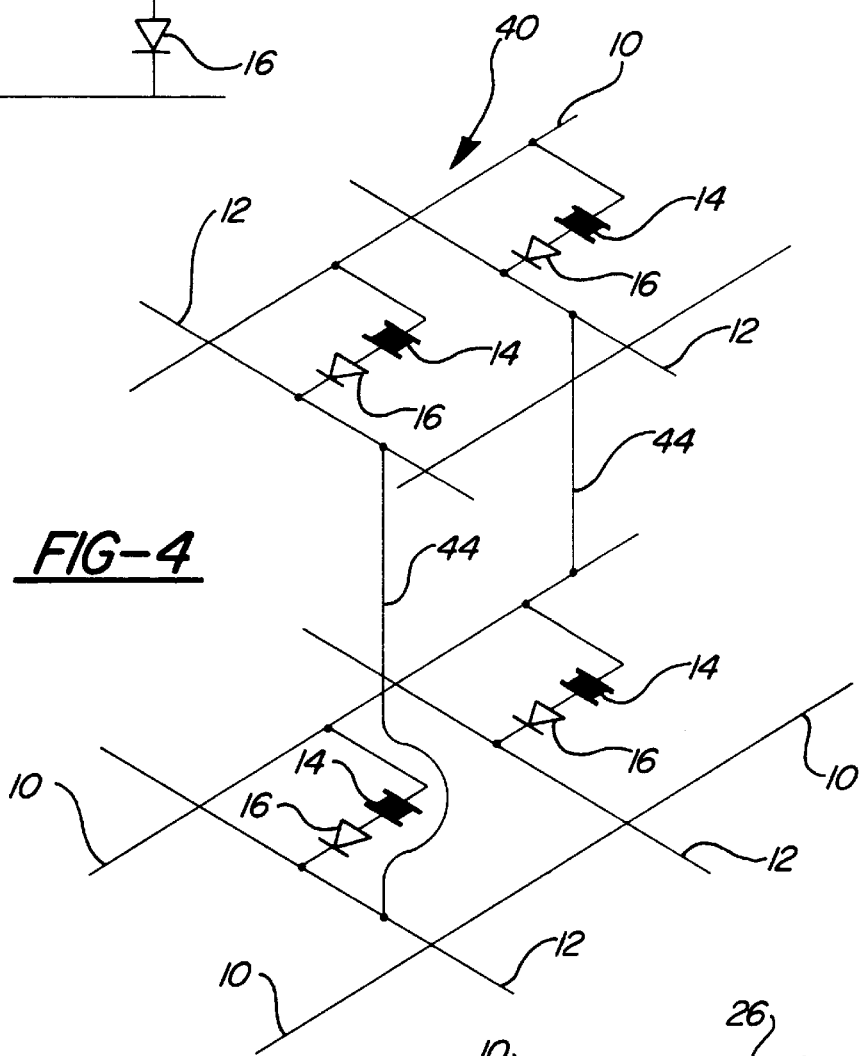
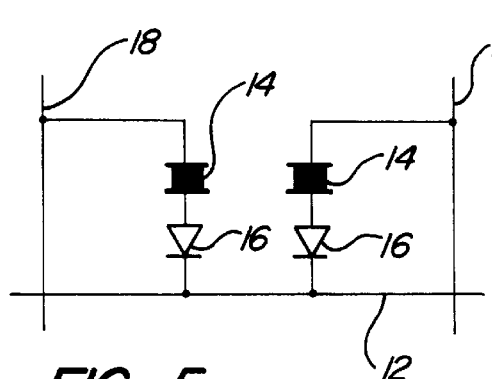
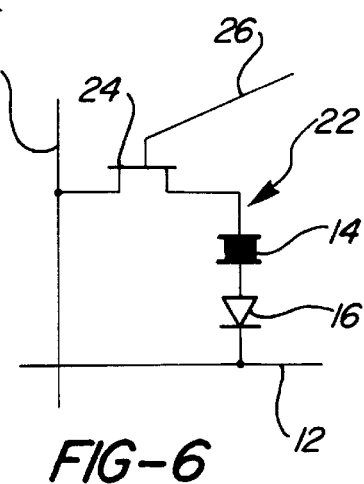

UNIVERSAL MEMORY ELEMENT AND METHOD OF PROGRAMMING SAME

FIELD OF THE INVENTION

The instant invention relates generally to programmable memory elements, and more specifically to erasable memory elements useful for data storage, multi-value logic and neural network/artificial intelligence computing. The memory elements are programmable by the input of energy of any one or plurality of the following forms: electrical, optical, pressure, and/or thermal.

The use of the memory elements in neural networks relates generally to parallel distributed processors. More specifically, this use relates to a multi-layered, vertically interconnected, parallel distributed processor which allows the implementation of neural network computers in which the degree of connectivity between individual neurons thereof may be set and reset to any one of a plurality of digital values, resulting in a computer having the ability to learn from, and adapt to, various data inputs.

BACKGROUND OF THE INVENTION

OVONIC MEMORY DEVICES PAST AND PRESENT

The general concept of utilizing electrically writeable and erasable phase change materials (i.e., materials which can be electrically switched between generally amorphous and generally crystalline states) for electronic memory applications is well known in the art, as is disclosed, for example, in U.S. Pat. No. 3,271,591 to Ovshinsky, issued Sep. 6, 1966 and in U.S. Pat. No. 3,530,441 to Ovshinsky, issued Sep. 22, 1970, both of which are assigned to the same assignee as the present invention, and both disclosures of which are incorporated herein by reference (hereinafter the "Ovshinsky patents").

As disclosed in the Ovshinsky patents, such phase change materials can be transformed between structural states of generally amorphous and generally crystalline local order or between different detectable states of local order across the entire spectrum between completely amorphous and completely crystalline states. That is, the Ovshinsky patents describe that the electrical switching of such materials is not required to take place between completely amorphous and completely crystalline states but rather can be in incremental steps reflecting changes of local order to provide a "gray scale" represented by a multiplicity of conditions of local order spanning the spectrum between the completely amorphous and the completely crystalline states. The early materials described by the Ovshinsky patents could also, if required, be switched between just the two structural states of generally amorphous and generally crystalline local order to accommodate the storage and retrieval of single bits of encoded binary information.

The multivalue-digital-multibit storage of the present invention differs from previous multibit storage disclosed in, for example, U.S. Pat. No. 5,687,112 to Ovshinsky et al., the disclosure of which is hereby incorporated by reference, in that the instant multibit storage is provided in multivalue, digital format while the previous multibit storage was achieved using grey scale analog storage. That is, in the prior art Ovonic memory multibit storage, the state of the device was determined by reading the resistance of the device on an analog scale. The entire grey scale dynamic range of resistance was divided into sub-ranges and each of these sub-ranges was assigned a specific state of programming for the device. The device was programmed to a specific resistance value within any one of the sub-ranges by providing the memory element with the proper current pulse of appropriate amplitude and duration. Once the resistance of the element was read, it was compared to the sub-range values to determine the state of programming of the element.

In the present Ovonic memory multivalue-digital-multibit storage, the device has only two general states of resistance, a high resistivity state and a low resistivity state. However, the device can be set very reliably from the high resistance state to the low resistance state by a single current pulse defined herein as a "set curret pulse". The set current pulse has an amplitude and a duration which is sufficient to transform the volume of memory material from the high resistance state to the low resistance state. The amplitude of the set current pulse is defined herein as the "set amplitude" and the duration of the set current pulse is defined herein as the "set duration". The act of transforming the volume of memory material from the high resistance state to the low resistance state is referred to herein as "setting" the volume of memory material from the high resistance state to the low resistance state.

This, by itself, is not what allows multivalue-digital-multibit storage. What is truly amazing about the instant Ovonic memory elements is that the set current pulse can be divided into sub-interval pulses and, with application of each sub-interval pulse, the resistance of the memory device does not substantially change until the total integrated duration of the sub-interval pulses is equal to or greater than the "set duration" described above. Once the final sub-interval pulse has delivered the last increment of the energy, the device is transformed to the low resistance state.

Thus, the "set duration" of the set current pulse can be divided into a desired number of sub-intervals. The number of sub-intervals corresponds to the total number of multivalue-digital programming states of the element. (In one embodiment, the total number of programming states is one greater than the number of sub-intervals). Once a specific number of sub-interval current pulses have been applied, the present state of the memory element is read by applying additional sub-interval programming pulses until the memory element is transformed from its high resistance state to its low resistance state. By reading the resistance of the element between each of the additionally applied sub-interval pulses, the number of additional pulses may be determined and compared to the number of total programming states. The difference is the present state of the memory element.

The process of reading the present state of the memory element changes the present state and is thus a "destructive read". Hence, after the memory element is read it must be "reprogrammed." This is done by first resetting the device to the high resistance state with a high amplitude current pulse referred to herein as a "reset current pulse", and then apply the number of sub-interval current pulses needed to return the element to the "present state" prior to the read operation.

FIG. 1 is a plot of the amplitude of an applied current pulse versus device resistance for an Ovonic memory element. Referring to FIG. 1, the different programming regimes can be distinguished. In the left side of the curve, the resistance of the device remains substantially constant (i.e., in its high resistance state) until a current pulse of sufficient energy is applied. The device is then transformed from its high resistance state to its low resistance state.

As the amplitude of the applied current pulse increases, the resistance of the device increases from the low resistance state to the high resistance state. This increase is both gradual and reversible as indicated by the arrows pointing in either direction up and down the right side of the curve. In this regime, the Ovonic memory element may be programmed to any resistance within a dynamic range of resistance values by applying a current pulse of appropriate amplitude. This type of programming scheme provides for analog, multistate, directly overwritable data storage.

The method of programming of the present invention exploits the left side of the curve in FIG. 1. In this regime, both the amplitudes and durations of the current pulses used for programming the device are important. The transition on this side of the curve is not reversible, as indicated by the single arrow on the left side of the curve. That is, once the device has made the transition from the high resistance state to the low resistance state, the device cannot be reset to the high resistance state by applying a programming pulse of reduced current. Instead, the device may be reset to the high resistance state by a high-amplitude current pulse (i.e., a "reset pulse") that drives the resistance up the right side of the curve. As described above, and as will be further described hereinbelow, the digital multivalue capability of the device, when programmed in this regime, stems from the ability of the Ovonic memory device to "accumulate" or "integrate" the energy of each program current pulse applied to the device.

The Ovonic memory element can store multiple bits of information in a single memory element, or, as described hereinbelow, can be used to provide a range of interconnectivities between the "neurons" of an artificially intelligent neural network. The number of bits of multibit storage (or fractions thereof) or the number of interconnectivity states depends upon the number of programming states (subintervals) that the element can provide. These devices, in addition to being useful for the data storage, and neural network applications described below, are also useful for such applications as multivalue-logic devices, comparative-logic applications, compliment base-n logic applications, counting applications, etc.

NEURAL NETWORKS

Digital data processors operate in a serial, algorithmic mode and are capable of performing complex calculations very accurately and quickly. Such processors are incorporated in serial computers generally referred to as von Neumann type machines and they implement data manipulations in a step-by-step fashion. Many information processing problems can be solved by this approach, particularly those requiring repetitive calculations; however, von Neumann type computers perform inadequately when doing tasks involving pattern recognition, classification or associative learning. A further drawback of von Neumann type computers is presented by the fact that before a problem is amenable to solution, it must be fully understood and reduced to a series of algorithms and the algorithms must be translated into an appropriate language for processing by a particular computer. Construction of an appropriate algorithm for tasks involving interpretation of patterns, particularly dynamically changing patterns such as those encountered in speech recognition, high speed character recognition and interpretation of moving scenery present extremely difficult, if not impossible, tasks.

The brain of even a relatively simple organism represents a data processor operating in a parallel, distributed mode and it is capable of quickly and accurately interpreting a large body of dynamically changing data without the need for input of a complex algorithm. Such operation is even more impressive in view of the fact that signal propagation in the brain occurs at a speed many orders of magnitude lower than the speed of propagation of an electrical signal in a silicon chip. Biological neural systems are characterized by a very high degree of connectivity and signal processing is effected by both the degree and architecture of these connections as well as their ability to be altered and reconfigured by specific stimuli.

Investigations of biological systems have led to the development of neural computing networks also termed "parallel, distributed data processors." Such networks are characterized by the presence of a large number of individual computing elements typically termed "neurons," "unit cells," or "nodes." These individual cells are each interconnected to a plurality of other unit cells in a complex network. Connections between pairs of unit cells may be characterized as weak or strong and also as excitory or inhibitory. By the addition of the appropriate input and output circuitry to one or more neural processors, a neural network computer may be constructed. However, efforts made heretofore to construct neural network computers have led to complex software and have been hampered by inadequate hardware.

Neural network computing systems are trained to perform a particular task, rather than being programmed to execute an algorithm. Training is accomplished by configuring the pattern of connections between individual neurons. Training may be done in a passive mode by simply presetting the pattern, and in some instances the strength, of the connections between individual unit cells so as to elicit a desired response to a particular input. A more sophisticated approach involves a dynamic method wherein the actual output response of the network to a given input signal is correlated with a desired output response to generate a training signal which is then applied to the network to reconfigure the connections. A network of this type is able to "learn" an appropriate response to a given input stimulation. A dynamically trainable system can learn from its mistakes and is capable of a large degree of self-teaching.

While it is generally agreed that the massively parallel non-linear logic of neural network computers will readily adapt them to a wide variety of practical applications involving pattern recognition, speech synthesis and the solving of multi-parameter problems, the actual implementation of neural network information processing systems has been hampered by a lack of appropriate computing hardware. Presently, most investigations into neural network computing systems are carried out by emulating neural network systems on conventional von Neumann type computers. While such simulation allows for testing of particular neural network architectures, the conventional digital computer, operating in a serial manner, inherently presents a bottleneck to the parallel distributed processing approach of neural network systems. In some instances, dedicated computing systems comprised of a plurality of processors arranged in a parallel relationship have been utilized for neural network simulations. While these types of machines do confer some advantages in terms of speed, they do not provide true distributed processing and they still cannot simulate fully a large scale, highly interconnected, reconfigurable array of neurons. Furthermore, they are limited by the interconnect problem associated with increasing numbers of nodes, as will be explained more fully herein below.

It is desirable to fabricate large scale, parallel, distributed data processors which comprise integrated arrays of interconnectable unit cells. The unit cells themselves are generally very simple devices for transferring data from one conductor to another, but the processor must be capable of establishing a complex pattern of interconnections therebetween. Two dimensional structures are not capable of providing a sufficiently large number of nodes to permit massively parallel, highly interconnected networks to be prepared; therefore three-dimensional structures are desired. Furthermore, computing power of the processor is greatly enhanced if the degree of connectivity between individual neurons may be controlled over a range of values.

Heretofore, the art has not been adequate to enable the construction of large three-dimensional processing arrays of this type. If the switching of connections and the control of the degree of connectivity of a parallel distributed processor is implemented through the use of conventional semiconductor circuitry, the complexity of each unit cell increases significantly, thereby limiting the size and number of unit cells in a network. It would clearly be desirable to control the connection between individual unit cells through a simple, reliable circuit element which may be set to any one of a plurality of values corresponding to different connectivities.

One attempt to provide a configurable neural network is disclosed by Thakoor et al in a Jet Propulsion Laboratory report numbered "JPLD-4166 (1987)" entitled "Content-Addressable High Density Memories Based on Neural Network Models." This approach relies upon an amorphous to crystalline transition first recognized by S. R. Ovshinsky, (see for example, "Reversible Electrical Switching Phenomena in Disordered Structures" Physical Review Letters V.21, N20, November 1968). The device of Thakoor et al. comprises a two-dimensional matrix of programmable amorphous silicon resistors interconnecting a series of simple unit cells. Each resistor is initially in a high resistivity state and may be set to a lower resistivity state by an appropriate pulse of current. By appropriately setting the resistors, the network is programmed. However, the resistors are not resettable, hence, the system is not capable of being reconfigured or otherwise operating in a dynamic learning mode. Also, the resistors are not settable across a range of connectivity values (different resistance values in this instance) and fine control of the degree of connectivity between interconnected cells is not possible.

Accordingly, it will be appreciated that there is a need for a simple neural network processor wherein the degree of connectivity between the unit cells may be simply and reliably set and reset in a cyclic, i.e. repeatable, mode. A system of this type is capable of a high degree of dynamic learning. It is further desirable that any such processor be adaptable to manufacture by standard device fabrication techniques. It is highly desirable that this network be structured as a large area, vertically interconnected three-dimensional device so as to increase processing density and decrease operational time.

While researchers have looked to the brain for initial inspiration in the development of neural network computing systems, they have continued to blindly rely upon conventional semiconductor structures and materials to implement these systems. Conventional semiconductor devices and materials operate in a volatile mode and are not well suited for neural circuitry. S. R. Ovshinsky has long recognized the fact that particular classes of materials can exhibit a range of physical properties which are analogous to those of biological neural systems. See, for example, "Analog Models for Information Storage and Transmission in Physiological Systems" by Stanford R. and Iris M. Ovshinsky in Mat. Res. Bull. Vol. 5, pp 681–690 (1970).

It has been found that certain materials, particularly chalcogen-based or chalcogen containing, materials may be selectably, reversibly and cyclically set to a plurality of different connectivity values related to a variety of physical properties such as electrical, optical, chemical, acoustic, pressure response and magnetic properties. In accord with the principles of the present invention these materials may be used as the basis for the interconnection of a number of unit cells into a three-dimensional neural network system. Materials of this type confer heretofore unattainable advantages in a neural network system insofar as they allow for ready programming and retraining of systems. Furthermore, these materials may be deposited in thin films over relatively large areas with high degrees of reliability and hence make possible the fabrication of large area, monolithic arrays of stacked unit cells and thereby provide a high density, massively parallel, distributed processing network.

The advent of parallel processing has raised the art of computing to a point where a new barrier of connectivity has arisen which limits further development of such systems. Like the brain, realistic neuronal models should have nodes with unit dimensions on the order of square microns and should have a high degree of complex and reconfigurable interconnectivity. (See: S. R. Ovshinsky and I. M. Ovshinsky), "Analog Models for Information Storage and Transmission in Physiological Systems" Mat. Res. Bull. Vol. 5, pp 681–690 (1970, Pergamon Press)). Intelligence of neuronal systems is proportional to the number of nodes or neurons in the system as well as to the number of interconnections to which each node is a party.

The computing systems provided by the present invention are true learning machines, unlike other parallel processors, insofar as they can adapt their connectivity to changing inputs in order to learn and can synthesize a creative output in response to novel stimuli. The systems of the present invention have utility in pattern recognition, adaptive control systems and in a wide variety of problem solving tasks.

DATA ENCRYPTION

The mulilevel capability of the Ovonic memory elements provides for the development of novel logic devices which will allow new computational methods to be developed. These computational methods will work more efficiently using this multlevel logic. In computationally intensive applications, such as cryptography, this novel logic will permit more powerful algorithms to be developed.

In today's computerized world people often need to make electronic money transactions for purchases and cash withdrawals. These transactions occur at ATM machines, businesses, through the mail and lately transactions are more and more frequently carried out through the Internet. Of these transactions, the ones in which data is transmitted over phone or data lines from one location to another (i.e. ATM transactions, many, if not most, business transactions and Internet transactions) are of great concern to credit card consumers. The transmission of unencrypted credit card information over phone or data lines presents an opportunity for high-tech thieves to steal and use this information. Since such data transmission has become the norm for monetary transactions, there is a great need for a foolproof method for encrypting such transaction data. The Ovonic memory devices, when programmed by the technique described herein, provide the physical means for such foolproof encryption.

DATA STORAGE

In the typical personal computer there are often four tiers of memory. Archival information is stored in inexpensive, slow, high storage capacity, non-volatile devices such as magnetic tape and floppy disks. This information is transferred, as needed, to faster and more expensive, but still non-volatile, hard disk memories. Information from the hard disks is transferred, in turn, to the still more expensive, faster, volatile system memory which uses semiconductor dynamic RAM (DRAM) devices. Very fast computers even transfer forth and back small portions of the information stored in DRAM to even faster and even more expensive volatile static RAM (SRAM) devices so that the microprocessor will not be slowed down by the time required to fetch data from the relatively slower DRAM. Transfer of information among the tiers of the memory hierarchy occupies some of the computer's power and this need for "overhead" reduces performance and results in additional complexity in the computer's architecture. The current use of the hierarchal structure, however, is dictated by the price and performance of available memory devices and the need to optimize computer performance while minimizing cost.

The electrically erasable phase change memories described in the Ovshinsky patents, as well as subsequent electrical solid state memory, had a number of limitations that prevented their widespread use as a direct and universal replacement for present computer memory applications, such as tape, floppy disks, magnetic or optical hard disk drives, solid state disk flash, DRAM, SRAM, and socket flash memory. Specifically, the following represent the most significant of these limitations: (i) a relatively slow (by present standards) electrical switching speed, particularly when switched in the direction of greater local order (in the direction of increasing crystallization); (ii) a relatively high input energy requirement necessary to initiate a detectable change in local order; and (iii) a relatively high cost per megabyte of stored information (particularly in comparison to present hard disk drive media).

The most significant of these limitations is the relatively high energy input required to obtain detectable changes in the chemical and/or electronic bonding configurations of the chalcogenide material in order to initiate a detectable change in local order. Also significant were the switching times of the electrical memory materials described in the Ovshinsky patents. These materials typically required times in the range of a few milliseconds for the set time (the time required to switch the material from the amorphous to the crystalline state); and approximately a microsecond for the reset time (the time required to switch the material from the crystalline back to the amorphous state). The electrical energy required to switch these materials typically measured in the range of about a microjoule. It should be noted that this amount of energy must be delivered to each of the memory elements in the solid state matrix of rows and columns of memory cells. Such high energy levels translate into high current carrying requirements for the address lines and for the cell isolation/ address device associated with each discrete memory element. Taking into consideration these energy requirements, the choices of memory cell isolation elements for one skilled in the art would be limited to very large single crystal diode or transistor isolation devices, which would make the use of micron scale lithography and hence a high packing density of memory elements impossible. Thus, the low bit densities of matrix arrays made from this material would result in a high cost per megabyte of stored information.

By effectively narrowing the distinction in price and performance between archival, non-volatile mass memory and fast, volatile system memory, the memory elements of the present invention have the capability of allowing for the creation of a novel, non-hierarchal "universal memory system". Essentially all of the memory in the system can be low cost, archival and fast. As compared to original Ovshinsky-type phase change electrical memories, the memory materials described herein provide over six orders of magnitude faster programming time (less than 30 nanoseconds) and use extremely low programming energy (less than 0.1 to 2 nanojoules) with demonstrated long term stability and cyclability (in excess of 10 trillion cycles). Also, experimental results indicate that additional reductions in element size can increase switching speeds and cycle life.

In general, development and optimization of the class of chalcogenide memory materials has not proceeded at the same rate as other types of solid state electrical memories that now have substantially faster switching times and substantially lower set and reset energies. These other forms of memories typically employ one or two solid state microelectronic circuit elements for each memory bit (as many as three or four transistors per bit) in some memory applications. The primary "non-volatile" memory elements in such solid state memories, such as EEPROM, are typically floating gate field effect transistor devices which have limited reprogrammability and which hold a charge on the gate of a field effect transistor to store each memory bit. Since this charge can leak off with the passage of time, the storage of information is not truly non-volatile as it is in the phase change media of the prior art where information is stored through changes in the actual atomic configuration or electronic structure of the chalcogenide material from which the elements are fabricated. These other forms of memories now enjoy acceptance in the marketplace.

In contrast to DRAM and SRAM, volatile memory devices, and other "flash" devices such as floating gate structures, no field effect transistor devices are required in the electrical memory devices of the present invention. In fact, the electrically erasable memory elements of the present invention represent the simplest electrical memory device to fabricate, comprising only two electrical contacts to a monolithic body of thin film chalcogenide material and an isolation device. As a result, very little chip "real estate" is required to store a bit of information, thereby providing for inherently high density memory chips. Further, and as described below, additional increases in information density can be accomplished through the use of multivalue-digital-multibit storage in each discrete memory cell.

The solid state, electronic memories presently in use are relatively expensive to manufacture, the consumer cost being typically about twenty times the cost per bit of storage capacity in relation to magnetic disk storage. On the other hand, these solid state, electronic memories provide certain advantages over magnetic disk memories in that they have no moving parts, require less electrical energy to operate, are easy to transport and store, and are more versatile and adaptable for use with portable computers and other portable electronic devices. As a matter of fact, hard drive manufacturers are forecasting rapid growth in the use of ever smaller hard drives and eventually solid state memory storage in the portable computer field. In addition, these solid state memories are usually true random access systems as opposed to disk types which require physical movement of the disk head to the proper data track for accessing the desired memory location. However, in spite of such advantages, the higher cost of solid state electrically erasable memories have prevented them from enjoying a substantial share of the market now dominated by magnetic memory systems. Although solid state electrically erasable memories could potentially be manufactured at reduced cost, the overall price-to-performance ratio of these devices is inadequate for them to fully replace magnetic disk systems.

Simply stated, no solid state memory system developed prior to the present invention, regardless of the materials from which it was fabricated, has been inexpensive; easily manufacturable; nonvolatile; electrically writeable; capable of multivalue-digital-multibit storage in a single cell; and capable of very high packing density. The memory system described hereinbelow, because it addresses all of the deficiencies of known memory systems, will find immediate widespread use as a universal replacement for virtually all types of computer memory currently in the marketplace. Further, because the memories of the present invention can be fabricated in an all thin-film format, three-dimensional arrays are possible for high speed, high density neural network, and artificial intelligence applications. The memory system of the present invention is therefore uniquely applicable to neural networks and artificial intelligence systems because its multi-layer, three-dimensional arrays provide massive amounts of information storage that is rapidly addressable, thus permitting learning from stored information.

SUMMARY OF THE INVENTION

Disclosed herein is a method of programming a digital, multi-level, phase-change memory element comprising a volume of phase-change memory material having at least a high resistance state and a detectably distinct low resistance state, and the ability to be set from the high resistance state to the low resistance state by a set energy pulse, the method comprising the step of: writing data into the memory element by applying a program energy pulse to the volume of memory material, wherein the program energy pulse is insufficient to set the memory material from the high resistance state to the low resistance state but sufficient to modify the memory material so that accumulation with at least one additional program energy pulse sets the memory material from the high resistance state to the low resistance state.

Also disclosed is a method of setting a volume of phase-change memory material from a high resistance state to a detectably distinct low resistance state, the method comprising the step of: applying a plurality of program energy pulses to the volume of memory material, wherein each of the energy pulses is insufficient to set the memory material from the high resistance state to the low resistance state but sufficient to modify the material so that the accumulation of the energy pulses causes the memory material to be set from the high resistance state to the low resistance state.

Also disclosed is a method of programming a digital, multistate, phase-change memory element comprising a volume of phase-change memory material having at least a high resistance state and a detectably distinct low resistance state, and the ability to be set from the high resistance state to the low resistance state by a set current pulse having a set amplitude and a set duration, the method comprising the step of: writing data into the memory element by applying one or more program current pulses to the volume of memory material, wherein each of the program current pulses has amplitude equal to the set amplitude, each of the program current pulses having duration insufficient to switch the memory material from the high resistance state to the low resistance state, the one or more program current pulses having integrated duration less than or equal to the set duration.

Also disclosed is a parallel processing network comprising: (A) means for a parallel input of a plurality of data; and (B) parallel distributed processing means operative to receive and process the parallel input of the plurality of data, the processing means including: (1) a three-dimensional array of stacked planes of a plurality of unit cells; each of the unit cells is a single repetition of a repetitive, three-dimensional electrically interconnected pattern; each unit cell including: (a) data input means; (b) data output means; and (c) a chalcogenide based multivalue-digital phase change memory element including a volume of memory material having a high resistance state and a detectably distinct low resistance state, and the ability to be changed from the high resistance state to the low resistance state by applying a set current pulse having sufficient energy, the ability to be programmed by a program current pulse which is insufficient to set the memory material but sufficient to modify the memory material so that accumulation with at least one additional program current pulse sets the memory material from the high resistance state to the low resistance state; and (2) means for establishing communication between the data input means of a first one of the unit cells in a first one of the stacked planes and the data output means of a second one of the unit cells in a second one of the stacked planes, the communication occurring through the volume of memory material of at least one of the unit cells, whereby the connection between the data input means and data output means is determined by the programmed state of the memory material.

The uniquely programmable memory elements are useful in applications such as neural networks and data storage devices, as well as multivalue-logic devices, comparative-logic applications, compliment base-n logic applications, counting applications, etc.

BRIEF DESCRIPTION OF THE DRAWINGS

FIG. 3 is a schematic depiction of a unit cell of a neural network structure in accordance with the principals of the present invention;

FIG. 4 is a schematic depiction of a portion of two stacked planes of unit cells of a neural network structure in accordance with the principals of the present invention;

FIG. 5 is a schematic depiction of another embodiment of unit cell of a neural network structure in accordance with the principals of the present invention and including inhibitory and excitory lines;

FIG. 6 is a schematic depiction of yet another unit cell of a neural network structure in accordance with the principals of the present invention and including a separate control line;

DETAILED DESCRIPTION OF THE INVENTION

Figure 1:
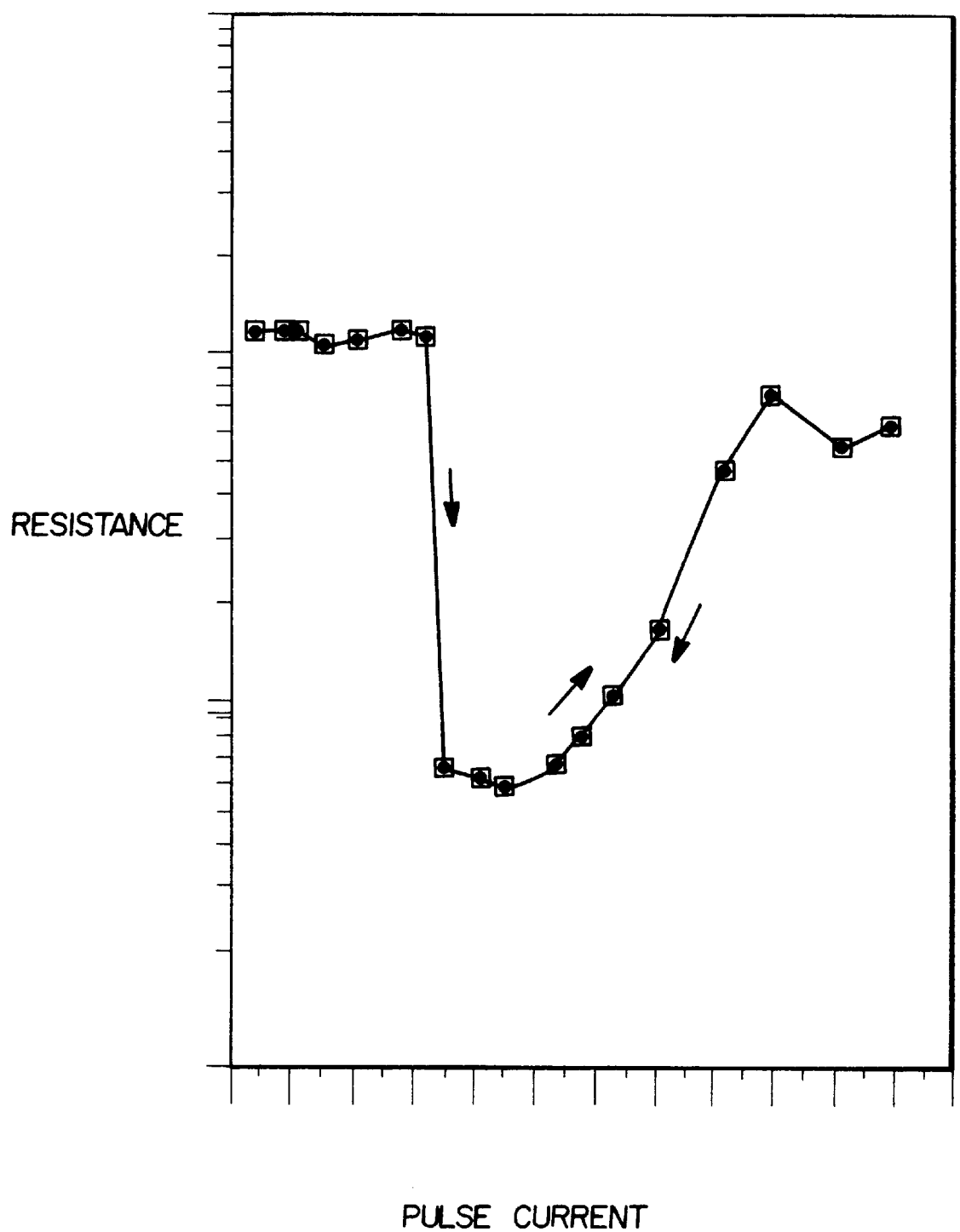
FIG. 1 is a graphical representation in which device resistance is plotted on the ordinate and the amplitude of the applied current pulse is plotted on the abscissa, said graph illustrating the different programming regimes of the Ovonic memory device.

Disclosed herein is a method of programming a multi-state, digital, phase-change memory element. The memory element comprises a volume of phase-change memory material having at least a high resistance state and a detectably distinct low resistance state. The high resistance state is characterized by a high electrical resistance, and the low resistance state is characterized by a low electrical resistance which is detectably distinct from the high electrical resistance.

The volume of memory material is capable of being transformed from the high resistance state to the low resistance state in response to the input of a single energy pulse which is referred to herein as a "set energy pulse". The set energy pulse has an amplitude and a duration which is sufficient to transform the volume of memory material from the high resistance state to the low resistance state. The amplitude of the set energy pulse is defined herein as the "set amplitude" and the duration of the set energy pulse is defined herein as the "set duration". The act of transforming the volume of memory material from the high resistance state to the low resistance state is referred to herein as "setting" (or "to set", etc.) the volume of memory material from the high resistance state to the low resistance state.

Generally, as defined herein, the "energy" applied to the volume of memory material may be of any form including, but not limited to electrical energy, particle beam energy, optical energy, thermal energy, electromagnetic energy, accoustical energy, and pressure energy. The electrical energy may take the form of electrical current or voltage. Preferably, the electrical energy takes the form of electrical current and the set energy pulse is a set current pulse having an amplitude equal to a "set amplitude" and a duration equal to a "set duration" which are necessary and sufficient to set the volume of memory material from the high resistance state to the low resistance state.

Though not wishing to be bound by theory, it is believed that the energy applied to the memory material by the set energy pulse changes the local order of at least a portion of the volume of memory material. Specifically, the applied energy causes at least a portion of the volume of memory material to change from a less-ordered "amorphous" condition to a more-ordered "crystalline" condition. It is noted that the term "amorphous", as used herein, refers to a condition which is relatively structurally less ordered or more disordered than single crystal and has a detectable characteristic, such as high electrical resistivity. The term "crystalline", as used herein, refers to a condition which is relatively structurally more ordered than amorphous and has at least one detectably different characteristic, such as a lower electrical resistivity. Preferably, the low electrical resistivity of the crystalline state is detectably distinct from the high electrical resistivity of the amorphous state. The single set energy pulse is an energy pulse having an amplitude and duration which is sufficient to cause the memory material to crystallize to the extent necessary so that it is transformed from its high resistance state to its low resistance state.

It is noted that the actual amplitude and duration selected for the set amplitude and set duration depend upon certain factors including, but not limited to, the size of the volume of memory material, the memory material used, the type of energy used, and the means of applying said energy to the memory material, etc.

As described above, the Ovonic memory element may be set from the high resistance state to the low resistance state by a single energy pulse referred to herein as a "set energy pulse". The Ovonic memory element may also be set from the high resistance state to the low resistance state by a plurality of energy pulses referred to herein as "program energy pulses" (to distinguish them from the set energy pulse). Unlike the set energy pulse, each of the plurality of program energy pulses is insufficient to cause the memory material to set from the high resistance state to the low resistance state. However, each of the program energy pulses is sufficient to modify at least a portion of the material so that the accumulation of the plurality of the program energy pulses is sufficient to cause the transformation from the high resistance state to the low resistance state.

Again not wishing to be bound by theory, it is believed that each of the plurality of program energy pulses applied to the volume of memory material "modifies" the material by causing some amount of crystallization (i.e., nucleation and/or crystal growth) in at least a portion thereof. The amount of crystallization caused by each of the program energy pulses alone is insufficient to cause the memory element to change from its high resistance to its low resistance states. However, the "accumulated" crystallization caused by the plurality of program energy pulses together is sufficient to set the memory element from its high resistance state to its low resistance state. Essentially, the volume of memory material "accumulates" the modifications (i.e., the crystallization) caused by each of the individual program energy pulses applied to the device.

Generally, the amplitudes and durations each of the plurality of program energy pulses may all be different. In one embodiment, the amplitudes are all the same and are preferably set equal to the amplitude of the set energy pulse (i.e., the "set amplitude") . The durations of each of the program energy pulses are selected by dividing the time interval of the set energy pulse, the "set duration", into a plurality of sub-intervals. (Hence, the integrated duration of all of the sub-intervals is equals to the "set duration".) The duration of each program energy pulse is set equal to a unique one of the sub-intervals.

Hence, a plurality of program energy pulses may be used to set the memory element from the high resistance state to the low resistance state where each of the program energy pulses has an amplitude equal to amplitude of the set energy pulse, and each of the program energy pulses has a duration equal to a unique one of the sub-intervals. As discussed above, the resistance of the memory element does not substantially change from the high resistance state until the last of the program energy pulses is applied to the volume of memory material. Once the final program energy pulse is applied, the device is transformed to the low resistance state.

It is again noted that the energy applied to the volume of memory material may be in the form of pulses of electrical current. Hence, the memory element may be set from the high resistance state to the low resistance state by a plurality of "program current pulses" where each program current pulse alone is insufficient to set the device. In one embodiment, the time duration defined by the duration of the "set current pulse" may be divided into sub-intervals. A plurality of program current pulses may be applied to the memory material where each program current pulse has an amplitude equal to the amplitude of the set current pulse and each program current pulse has a duration equal to a unique one of the sub-intervals. The device will be set after the last program current pulse is applied.

Disclosed herein is a novel method of programming a phase-change memory element. The method of programming the memory element described herein includes the step of writing data into the memory element. The writing data step comprises the step of applying a "program energy pulse" to the volume of memory material. As discussed, the "program energy pulse" is a pulse of energy which is insufficient to set the memory material from the high resistance state to the low resistance state. However, the program energy pulse is sufficient to modify the volume of memory material so that the accumulation of said program energy pulse with at least one additional program energy pulse will set the volume of memory material from the high resistance state to the low resistance state.

In one embodiment, data may be written into the memory element by applying one or more program energy pulses to the volume of memory material. Generally, the amplitudes and durations of the program energy pulses used may all be different. The amplitude of each program energy pulse may be chosen equal to the "set amplitude" of the set energy pulse described above. The duration of each program energy pulse is such that each pulse alone is insufficient to set the volume of memory material from the high resistance state to the low resistance state, and the integrated duration of all of the program energy pulses is less than or equal to the set duration of the set energy pulse.

As discussed, energy may be applied to the volume of memory material in the form of current pulses. Referring to FIG. 1, as the amplitude of an applied current pulse increases to a sufficient amplitude, the device switches from a high resistance state to a low resistance state. A single current pulse sufficient to set the memory material from the high resistance state to the low resistance state is referred to herein as a "set current pulse" having an aptitude referred to as a "set amplitude" and a duration referred to as a "set duration".

Data may be written into the memory element by applying one or more "program current pulses" to the volume of memory material where each program current pulse is insufficient to set the device. Generally, the amplitudes and durations of the program current pulses may all be different. In one embodiment, the amplitude of each program current pulse is chosen equal to the set amplitude defined above. Further, the duration of each program current pulse is chosen (1) so that each pulse alone is insufficient to cause the material to be transformed from its high resistance state to its low resistance state, and (2) so that the integrated duration of all of the program current pulses is less than or equal to the "set duration" defined above.

In one implementation of the present programming method the time duration defined by "set duration" is divided into sub-intervals. The number of sub-intervals is chosen to be one less than the desired number of total possible programming states. As an example, if five total programming states are desired, the time interval "set duration" is divided into four sub-intervals (such that the integrated duration of all four sub-intervals is equal to "set duration"). Preferably, all of the sub-intervals are equal (however, other implementations are possible using sub-intervals that are not equal).

The element may be programmed to a desired "programmed state" by applying one or more program current pulses where each program current pulse has a duration equal to one of the sub-intervals and an amplitude equal to the "set amplitude" of the set current pulse. In the example using five total states, if no program current pulse is applied—the memory element remains in state I, if one program current pulse is applied—the memory element is in state II, if two program current pulses are are applied—the memory element is in state III, if three sub-interval pulses are applied—the memory element is in state IV, and if four sub-interval pulses are applied—the memory element is in state V.

It is noted that the resistance of the memory material does not substantially change until the total integrated duration of the sub-interval pulses is either equal to or greater than the "set duration". In the example above, the resistance will not substantially change until the forth sub-interval pulse is applied. After the forth pulse is applied, the resistance of the memory element will be transformed from the high resistance state to the low resistance state.

The programmed state of the memory element can be read by applying additional program current pulses until the memory material is set to its low resistance state and counting the number of additional pulses applied. In the example above, if one program current pulse was initially applied to write data into the memory element, the programmed state is state II. In this case three additional program energy pulses would have to be applied in order to set the memory elemnt to the low resistance state. The programmed state may be determined by substracting the number of additional pulses needed (in this case 3) from the total number of possible states (in this case 5). Hence, the programmed state is 5−3=2 (i.e., state II).

Hence, the device may be read by first determining whether the volume of memory material is in the low resistance state. If it is not, then an additional program energy pulse is applied and the resistance of the device is again determined. If the memory element is still not in the low resistance state, then another additional program energy pulse is applied and the resistance of the device is again determined. This procedure is repeated until it is determined that the device is in the low resistance state. The number of additional program current pulses required to set the device are counted (i.e., a counter may be incremented for each additional program energy pulse required), and this number is used to determined the programmed state.

The method of programming may further include the step of erasing data from the memory element by applying a "reset energy pulse" to the volume of memory material. The reset energy pulse is an energy pulse sufficient to change the resistance of the volume of memory material from the low resistance state to the high resistance state. This is preferably an energy pulse sufficient to change at least a portion of the volume of memory material from a more-ordered crystalline state to a less-ordered amorphous state. It is noted that the program energy pulse (or program current pulse) described above is insufficient to change the resistance of the volume of memory material from the low resistance state to the high resistance state. As note above, the form of energy may be electrical current. Hence, the "reset current pulse" is a pulse of electrical current sufficient to change the resistance of the volume of memory element from the low resistance state to the high resistance state.

It is noted that applying the additional program current pulses to read the memory element sets the memory material to its low resistance state. Hence, the reading step changes the programmed state of the memory element is is thus a "destructive" read. After being read, the memory element must thus be "reprogrammed" back to the programmed state of the memory element prior to the read.

Hence, the method of programming of the present invention may further include the step of reprogramming the memory element to the programmed state. The reprogramming step comprises the step of applying a "reset pulse" to the memory element. The reset pulse is a pulse of electrical current which is sufficient to change the resistance of the volume of memory material from the low resistance state to the high resistance state. Preferably, the reset current pulse is a high amplitude pulse.

The reprogramming step further comprises the step of applying a sufficient number of additional program current pulses to the memory element so that the state of the memory element is returned to its programmed state prior to being read.

While much of the discussion hereinabove is in terms of current pulses, it is noted that any form of energy may be used to implement the programming method of the present invention. The types of energy include electrical energy, optical energy, electron beam energy, thermal energy, electromagetic energy, acoustical energy, and pressure energy.

As discussed above, in one embodiment of the present invention, the method of programming described herein uses pulses of electrical current to program the memory element. To apply the current pulses, the memory element of the present invention further comprises means for delivering electrical energy to the volume of memory material. In general, "current" is defined as the flow of electric charge. Examples of electric charge are electrons, protons, positive and negative ions, and any other type of charged particle. The flow of electric charge may be due to a beam of charged particles such as an electron beam or a proton beam.

In one embodiment of the present invention, the means for delivering is a first contact and a second contact. Each of the contacts is adjoining the volume of memory material. As used herein, a contact is "adjoining" the volume of memory material if at least a portion of the contact is actually touching the memory material.

Figure 2:
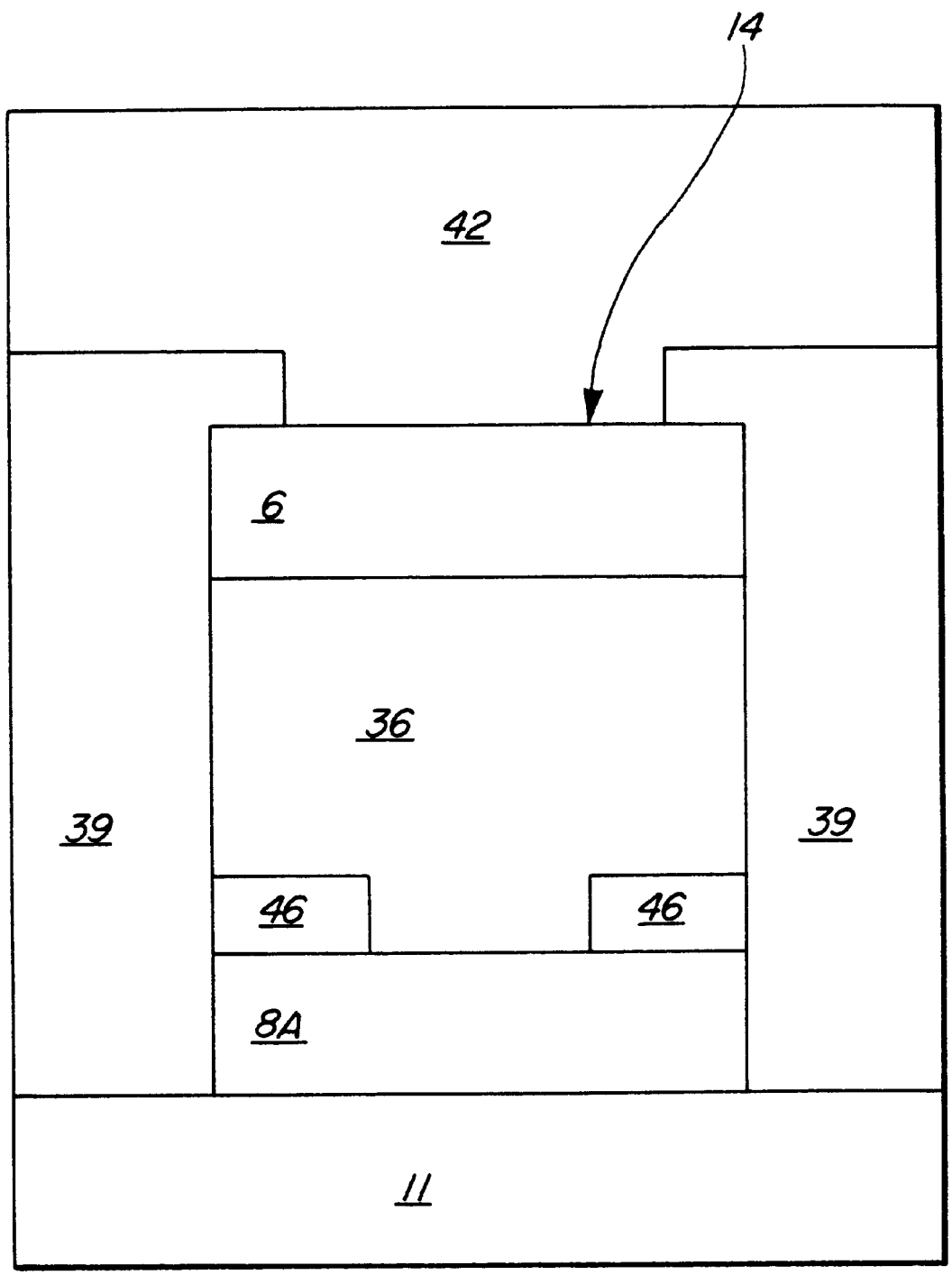
FIG. 2 is a cross-sectional view of a memory element of the present invention having a first and a second contact each adjoining the volume of memory material.

In another embodiment of the invention, the first and second contacts are a pair of spacedly disposed planar contacts adjoining the volume of memory material. Each of the contacts may be comprised of one or more thin-film contact layers. FIG. 2 shows a cross-sectional view of an embodiment of the memory element formed on a single crystal silicon semiconductor wafer 10. The memory element includes the memory material 36, a first spacedly disposed contact 6 adjoining the volume of memory material, and a second spacedly disposed contact 8A adjoining the volume of memory material. In the embodiment shown, the first and second contacts 6, 8A are planar contacts. At least one of the contacts 6, 8A may comprise one or more thin-film layers. An example of a memory element wherein the first and second contacts 6, 8A comprise two thin-film layers was disclosed in commonly assigned U.S. patent application Ser. No. 08/739,080, the disclosure of which is incorporated herein by reference.

The contacts 6, 8A comprises a thin-film layer adjoining the volume of memory material wherein said thin-film layer includes one or more elements selected from the group consisting of Ti, V, Cr, Zr, Nb, Mo, Hf, Ta, W and mixtures or alloys thereof in combination with two or more elements selected from the group consisting of B, C, N, O, Al, Si, P, S and mixtures or alloys thereof. Examples of materials include TiCN, TiAlN, TiSiN, W—$Al_2O_3$, and Cr—$Al_2O_3$.

The layer of memory material 36 is preferably deposited to a thickness of about 200 Å to 5,000 Å, more preferably of about 250 Å to 2,500 Å, and most preferably of about 250 Å to 500 Å in thickness.

The memory element shown in FIG. 2 may be formed in a multi-step process. Contact layer 8A, and insulation layer 46 are first deposited and the insulation layer 46 is then etched so that there will be an area of contact between the memory material 36 and contact layer 8A. Memory layer 36 and contact layer 6 are then deposited and the entire stack of layers 8A, 46, 36 and 6 are etched to the selected dimensions. Deposited on top of the entire structure is a layer of insulating material 39. Examples of insulating materials are $SiO_2$, $Si_3N_4$ and tellurium oxygen sulfide (e.g., TeOS). The layer of insulating material 39 is etched and a layer of aluminum 42 is deposited to form the second electrode grid structure 42 which extends perpendicular in direction to the conductors 12 and complete the X-Y grid connection to the individual memory elements. Overlaying the complete integrated structure is a top encapsulating layer of a suitable encapsulant such as $Si_3N_4$ or a plastic material such as polyamide, which seals the structure against moisture and other external elements which could cause deterioration and degradation of performance. The $Si_3N_4$ encapsulant can be deposited, for example, using a low temperature plasma deposition process. The polyamide material can be spin coated and baked after deposition in accordance with known techniques to form the encapsulant layer.

In still another embodiment of the invention, the means for delivering comprises at least one "tapered" contact. A tapered contact is a contact which tapers to a peak adjoining the volume of memory material. The embodiment of a memory element using a tapered contact is described in commonly assigned U.S. Pat. No. 5,687,112 to Ovshinsky et al, the disclosure of which is incorporated herein by reference.

The means for delivering may also be at least one field emitter. Field emitters are discussed in U.S. Pat. No. 5,557,596 to Gibson et al., the disclosure of which is incorporated herein by reference. The field emitter tapers to a peak which is positioned in close proximity to the volume of memory material. As defined herein, the terminology "in close proximity" means that the field emitter does not actually make contact with the volume of memory material. Preferably, the field emitter is placed between about 50 Å and about 100,000 Å from the volume of memory material. More preferably, the field emitter is placed between about 500 Å and about 50,000 Å from the volume of memory material.

The field emitter generates an electron beam from its tapered peak. As discussed in the '596 Patent, the electron beam may be extracted from the field emitter in many different ways. A circular gate may be positioned around the field emitter and an electric potential placed between the field emitter and the gate. Alternately, an electric potential may be placed between the field emitter and the actual volume of memory material. In still another embodiment, a contact (such as a planar contact) may be positioned adjoining the volume of memory material and spacedely disposed from the field emitter. An electric potential may be placed between the field emitter and the planar contact so that the electron beam is urged toward the volume of memory material and impinges the memory material. More than one field emitter may be used.

The field emitters may be made in a number of ways. One way is discussed in "Physical Properties of Thin-Film Field Emission Cathods With Molybdenum Cones", by Spindt et al, published in the Jounal of Applied Physics, Vol. 47, No. 12, December 1976. Another way is discussed "Fabrication and Characteristics of Si Field Emitter Arrays," by Betsui, published in Tech. Digest 4th Int. Vacuum Microelectronics Conf., Nagahama, Japan, page 26, 1991.

A partial vacuum may exist between the field emitter and the volume of memory material. As discussed in the '596 Patent, the partial vacuum may be at least $10^{-5}$ torr. Methods of fabricating field emitters in vacuum cavities are known in the art. Techniques are discussed in "Silicon Field Emission Transistors and Diodes," by Jones, published in IEEE Transactions on Components, Hybrids and Manufacturing Technology, 15, page 1051, 1992. Alternately, a gas may be interposed between the field emitter and the volume of memory material.

In yet another embodiment of the present invention, the means for delivering electric current is a tunneling contact which is placed in close proximity to the volume of memory material. The tunneling contact may be similar to a field emitter. It may taper to a peak that is positioned is close proximity to the volume of memory material. The tunneling contact does not actually touch the memory material, however, it is positioned within the quantum mechanical tunneling distance. Preferably, this distance is less than 50 Å.

Examples of phase-change materials were provided in U.S. Pat. No. 3,271,591 and U.S. Pat. No. 3,530,441, the disclosures of which are hereby incorporated by reference. Other examples of phase-change materials are found in commonly assigned U.S. Pat. No. 5,166,758, U.S. Pat. No. 5,296,716, U.S. Pat. No. 5,534,711, U.S. Pat. No. 5,536,947, and U.S. Pat. No. 5,596,522, and U.S. Pat. No. 5,687,112, the disclosures of which are also incorporated by reference herein.

The phase-change material is preferably "non-volatile". As used herein "non-volatile" means that the phase-change material will maintain the integrity of the information stored by the memory cell (within a selected margin of error) without the need for a periodic refresh.

The volume of memory material may comprise a mixture of a dielectric material and the phase-change material described above. The "mixture" may be either a heterogeneous mixture or a homogeneous mixture. Preferably, the mixture is a heterogeneous mixture. Memory material comprising a mixture of a phase-change material and a dieletric material is disclosed in commonly assigned U.S. patent application Ser. No. 09/063,174, the disclosure of which are incorporated herein by reference.

Generally, the phase-change material of the present invention is formed from a plurality of constituent atomic elements. Preferably, the phase-change material includes one or more elements selected from the group consisting of Te, Se, Ge, Sb, Bi, Pb, Sn, As, S, Si, P, O and mixtures or alloys thereof. The phase-change material preferably includes at least one chalcogen element and may include at least one transition metal element. Preferably, the chalcogen element is selected from the group consisting of Te, Se and mixtures or alloys thereof. More preferably, the chalcogen element is a mixture of Te and Se.

The term "transition metal" as used herein includes elements 21 to 30, 39 to 48, 57 and 72 to 80. Preferably, the transition metal element is selected from the group consisting of Cr, Fe, Ni, Nb, Pd, Pt and mixtures or alloys thereof. Most preferably the transition metal is Ni. Specific examples of such multi-element systems are set forth hereinafter with respect to the Te:Ge:Sb system with or without Ni and/or Se.

It is further believed that the size of the crystallites which exist in the bulk of the semiconductor and memory material is relatively small, preferably less than about 2000 Å, more preferably between about 50 Å and 500 Å, and most preferably on the order of about 200 Å to about 400 Å.

Many of the phase-change materials of the present invention have a tendency toward the formation of more and smaller crystallites per unit volume. Crystallite sizes of the widest preferential range of representative materials embodying the present invention have been found to be far less than about 2000 Å, and generally less than the range of about 2,000 Å to 5,000 Å which was characteristic of prior art materials. Crystallite size is defined herein as the diameter of the crystallites, or of their "characteristic dimension" which is equivalent to the diameter where the crystallites are not spherically shaped.

It has been determined that compositions in the highly resistive state of the class of TeGeSb materials which meet the criteria of the present invention are generally characterized by substantially reduced concentrations of Te relative to that present in prior art electrically erasable memory materials. Examples of TeGeSb materials are provided in commonly assigned U.S. Pat. No. 5,534,711, U.S. Pat. No. 5,536,947, and U.S. Pat. No. 5,596,522.

In one composition that provides substantially improved electrical switching performance characteristics, the average concentration of Te in the as deposited materials was well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. The percentages given are atomic percentages which total 100% of the atoms of the constituent elements. Thus, this composition may be characterized as $Te_a Ge_b Sb_{100-(a+b)}$. These ternary Te—Ge—Sb alloys are useful starting materials for the development of additional phase-change materials having even better electrical characteristics.

The phase-change materials of the present invention preferably include at least one chalcogen and may include one or more transition metals. The phase-change materials which include transition metals are elementally modified forms of the phase-change materials in the Te—Ge—Sb ternary system. That is, the elementally modified phase-change materials constitute modified forms of the Te—Ge—Sb phase-change alloys. This elemental modification is achieved by the incorporation of transition metals into the basic Te—Ge—Sb ternary system, with or without an additional chalcogen element, such as Se. Generally the elementally modified phase-change materials fall into two categories.

The first category is a phase-change material which includes Te, Ge, Sb and a transition metal, in the ratio $(Te_a Ge_b Sb_{100-(a+b)})_c TM_{100-c}$ where the subscripts are in atomic percentages which total 100% of the constituent elements, wherein TM is one or more transition metals, a and b are as set forth herein above for the basic Te—Ge—Sb ternary system and c is between about 90% and about 99.99%. The transition metal preferably include Cr, Fe, Ni, Nb, Pd, Pt and mixtures or alloys thereof.

Specific examples of phase-change materials encompassed by this system would include $(Te_{56}Ge_{22}Sb_{22})_{95}Ni_5$, $(Te_{56}Ge_{22}Sb_{22})_{90}Ni_{10}$, $(Te_{56}Ge_{22}Sb_{22})_{95}Cr_5$, $(Te_{56}Ge_{22}Sb_{22})_{90}Cr_{10}$, $(Te_{56}Ge_{22}Sb_{22})_{95}Fe_5$, $(Te_{56}Ge_{22}Sb_{22})_{90}Fe_{10}$, $(Te_{56}Ge_{22}Sb_{22})_{95}Pd_5$, $(Te_{56}Ge_{22}Sb_{22})_{90}Pd_{10}$, $(Te_{56}Ge_{22}Sb_{22})_{95}Pt_5$, $(Te_{56}Ge_{22}Sb_{22})_{95}Pt_{10}$, $(Te_{56}Ge_{22}Sb_{22})_{95}Nb_5$, $(Te_{56}Ge_{22}Sb_{22})_{90}Nb_{10}$, $(Te_{56}Ge_{22}Sb_{22})_{90}Ni_5Cr_5$, $(Te_{56}Ge_{22}Sb_{22})_{90}Ni_5Fe_5$, $(Te_{56}Ge_{22}Sb_{22})_{90}Cr_5Fe_5$, $(Te_{56}Ge_{22}Sb_{22})_{90}Pd_5Cr_5$, $(Te_{56}Ge_{22}Sb_{22})_{90}Ni_5Pd_5$, $(Te_{56}Ge_{22}Sb_{22})_{90}Pd_5Pt_5$, etc.

The second category is a phase-change material which includes Te, Ge, Sb, Se and a transition metal, in the ratio $(Te_aGe_bSb_{100-(a+b)})_cTM_dSe_{100-(c+d)}$ where the subscripts are in atomic percentages which total 100% of the constituent elements, TM is one or more transition metals, a and b are as set forth hereinabove for the basic Te—Ge—Sb ternary system, c is between about 90% and 99.5% and d is between about 0.01% and 10%. The transition metal can preferably include Cr, Fe, Ni, Pd, Pt, Nb and mixtures or alloys thereof. Specific examples of memory materials encompassed by this system would include $(Te_{56}Ge_{22}Sb_{22})_{90}Ni_5Se_5$, $(Te_{56}Ge_{22}Sb_{22})_{80}Ni_{10}Se_{10}$, $(Te_{56}Ge_{22}Sb_{22})_{90}Cr_5Se_5$, $(Te_{56}Ge_{22}Sb_{22})_{80}Cr_{10}Se_{10}$, $(Te_{56}Ge_{22}Sb_{22})_{90}Fe_5Se_5$, $(Te_{56}Ge_{22}Sb_{22})_{80}Fe_{10}Se_{10}$, $(Te_{56}Ge_{22}Sb_{22})_{90}Pd_5Se_5$, $(Te_{56}Ge_{22}Sb_{22})_{80}Pd_{10}Se_{10}$, $(Te_{56}Ge_{22}Sb_{22})_{90}Pt_5Se_5$, $(Te_{56}Ge_{22}Sb_{22})_{80}Pt_{10}Se_{10}$, $(Te_{56}Ge_{22}Sb_{22})_{90}Nb_5Se_5$, $(Te_{56}Ge_{22}Sb_{22})_{80}Nb_{10}Se_{10}$, $(Te_{56}Ge_{22}Sb_{22})_{85}Ni_5Cr_5Se_5$, $(Te_{56}Ge_{22}Sb_{22})_{80}Ni_5Fe_5Se_{10}$, $(Te_{56}Ge_{22}Sb_{22})_{85}Cr_5Fe_5Se_5$, $(Te_{56}Ge_{22}Sb_{22})_{85}Ni_5Pd_5Se_5$, $(Te_{56}Ge_{22}Sb_{22})_{80}Ni_5Pt_5Se_{10}$, $(Te_{56}Ge_{22}Sb_{22})_{85}Ni_5Nb_5Se_5$, $(Te_{56}Ge_{22}Sb_{22})_{85}Pd_5Cr_5Se_5$, $(Te_{56}Ge_{22}Sb_{22})_{80}Pd_5Pt_5Se_{10}$, $(Te_{56}Ge_{22}Sb_{22})_{85}Pd_5Nb_5Se_5$, $(Te_{56}Ge_{22}Sb_{22})_{85}Pt_5Nb_5Se_5$, etc.

The phase-change material possesses substantially non-volatile set resistance values. However, if the resistance value of the phase-change material does drift from its original set value, "compositional modification", described hereinafter, may be used to compensate for this drift. As used herein, the term "non-volatile" refers to the condition in which the set resistance value remains substantially constant for archival time periods. Of course, software (including the feedback system discussed hereinafter) can be employed to insure that absolutely no "drift" occurs outside of a selected margin of error.

"Compositional modification" is defined herein to include any means of compositionally modifying the phase-change material to yield substantially stable values of resistance, including the addition of band gap widening elements to increase the inherent resistance of the material. One example of compositional modification is to include graded compositional inhomogeneities with respect to thickness. For instances, the volume of phase-change material may be graded from a first Te—Ge—Sb alloy to a second Te—Ge—Sb alloy of differing composition. The compositional grading may take any form which reduces set resistance value drift. For example, the compositional grading need not be limited to a first and second alloy of the same alloy system. Also, the grading can be accomplished with more than two alloys. The grading can be uniform and continuous or it can also be non-uniform or non-continuous. A specific example of compositional grading which results in reduced resistance value drift includes a uniform and continuous grading of $Ge_{14}Sb_{29}Te_{57}$ at one surface to $Ge_{22}Sb_{22}Te_{56}$ at the opposite surface.

Another manner of employing compositional modification to reduce resistance drift is by layering the volume of phase-change material. That is, the volume of phase-change material may be formed of a plurality of discrete, relatively thin layers of differing composition. For example, the volume of phase-change material may include one or more pairs of layers, each one of which is formed of a different Te—Ge—Sb alloy. Again, as was the case with graded compositions, any combination of layers which results in substantially reduced resistance value drift can be employed. The layers may be of similar thickness or they may be of differing thickness. Any number of layers may be used and multiple layers of the same alloy may be present in the volume of memory material, either contiguous or remote from one another. Also, layers of any number of differing alloy composition may be used. A specific example of compositional layering is a volume of memory material which includes alternating layer pairs of $Ge_{14}Sb_{29}Te_{57}$ and $Ge_{22}Sb_{22}Te_{56}$.

Yet another form of compositional inhomogeneity to reduce resistance drift is accomplished by combining compositional grading and compositional layering. More particularly, the aforementioned compositional grading may be combined with any of the above described compositional layering to form a stable volume of memory material. Exemplary volumes of phase-change material which employ this combination are: (1) a volume of phase-change material which includes a discrete layer of $Ge_{22}Sb_{22}Te_{56}$ followed by a graded composition of $Ge_{14}Sb_{29}Te_{57}$ and $Ge_{22}Sb_{22}Te_{56}$ and (2) a volume of phase-change material which includes a discrete layer of $Ge_{14}Sb_{29}Te_{57}$ and a graded composition of $Ge_{14}Sb_{29}Te_{57}$ and $Ge_{22}Sb_{22}Te_{56}$.

The memory material may be made by methods such as sputtering, evaporation or by chemical vapor deposition (CVD), which may be enhanced by plasma techniques such as RF glow discharge. The memory material is most preferably made by RF sputtering or evaporation. It may be formed by multiple source sputtering techniques making use of a plurality of targets, usually a target of the phase-change material and a target of the dielectric material. With these targets arranged in opposition to a substrate, sputtering is carried out while the substrate is rotated relative to each target. A target containing both phase-change and dielectric materials may be used as well. As well, substrate heating may be used to control the morphology of the phase-change material within the composite memory material formed by affecting crystal growth as well as crystal aggregation via surface mobility.

One use of the memory element embodiment of the instant invention is that of a parallel processing network. A parallel processing network comprises a vertically interconnected parallel distributed processing array which includes a plurality of stacked matrices of unit cells. Each unit cell is in data transmissive communication with at least one other unit cell in an adjoining plane. Preferably, the unit cells in a given plane are also interconnected to some degree. In this manner, a high degree of connectedness between individual unit cells of the array may be established. Parallel processing networks are discussed in commonly assigned U.S. Pat. No. 5,159,661, the contents of which are incorporated by reference herein.

Each of the unit cells includes the Ovonic memory multivalue-digital storage element described above. As discussed, the device has only two general states of resistance, a high resistance state and a low resistance state. However, the device switches very reliably from the high resistance state to the low resistance state by a current pulse of sufficient energy referred to herein as a "set current pulse." The set current pulse has a set amplitude and a set duration which is sufficient to set the volume of memory material from the high resistance state to the low resistance state.

The set current pulse can be divided into sub-interval pulses referred to as "program current pulses". With application of each sub-interval pulse, the resistance of the memory device does not substantially change until the total duration of the sub-interval pulses (i.e. the total integrated energy input) is equal to or greater than the "set duration" described above. Once the final sub-interval pulse has delivered that last of the integrated energy, the device switches to the low resistance state.

Thus, the time interval "set duration" can be divided into a specific number of sub-intervals. The number of sub-intervals is related to the number of multivalue-digital programming states of the element. Programming the memory element to a particular programmed state permits the establishment of various degrees of connection between individual unit cells.

Referring now to FIG. 3, there is shown a typical unit cell which may be employed in the present invention. The unit cell includes a data input line 10 and a data output line 12. Communication between the two lines 10, 12 is established via a chalcogenide based Ovonic multivalue-digital phase change memory element 14. The memory element has been described above. The memory element includes a volume of memory material having a high resistance state and a detectably distinct low resistance state, and the ability to be changed from the high resistance state to the low resistance state by applying a set current pulse having sufficient energy. Further, the volume of memory material has the ability to be programmed by to one of a plurality of detectably distinct programmed states by one or more "program current pulses". As discussed, each of the program current pulses is insufficient to set the memory material from the high resistance state to the low resistance state but it is sufficient to modify the memory material so that accumulation with at least one additional program current pulse can set the memory material from the high resistance state to the low resistance state.

FIG. 4 depicts, in schematic form, a portion of a stacked array of two matrices 140, 142, each including unit cells interconnected by a vertical via 44. Similar stacked matrices are contemplated within the scope of the present invention for the other unit cells shown herein.

The unit cell further includes an isolation device, such as a diode 16. Typically, the unit cells are arranged in an array wherein the data input 10 and data output lines 12 comprise a series of rows and columns and in this embodiment an isolation device 16 functions to prevent cross talk between adjacent unit cells. The isolation device is depicted as being a diode 16, and as such may comprise a thin film diode such as a polycrystalline silicon diode although amorphous, polycrystalline or crystalline diodes of various other materials may be similarly employed as may be other devices such as transistors. When structures comprising chalcogenides and polycrystalline diodes are to be fabricated, the diodes are generally deposited as amorphous devices, utilizing thin film technology and they are subsequently crystallized. In accord with the present invention, it has been found advantageous to crystallize the diode material through the use of a short pulse of light from a laser or similar source so as to rapidly crystallize the material without damaging the chalcogenide material.

The cell of FIG. 3 is part of a matrix of generally identical cells arranged in rows and columns. The processor of the present invention includes a stacked array of such matrices and at least some of the cells in a first matrix are interconnected with cells in a second matrix so that the data output of the cell in the first plane 140 communicates with the input of the cell in a second plane 142.

FIG. 4 depicts, in schematic form, a portion of a stacked array of two matrices 140, 142, each including unit cells interconnected by a vertical via 44. Similar stacked matrices are contemplated within the scope of the present invention for the other unit cells shown herein. It is noted that the vertical via 44 provides means for establishing communication between the data input line 10 of a first unit cell in the matrix 140 and the data output line 12 of a second unit cell in the matrix 142. As seen from FIG. 4 the communication occurs by through a volume of memory material of at least one of the unit cells. The connection between a data input line 10 in the matrix 140 and a data output line 12 in the matrix 142 is determined by the distinguishable programmed states of the chalcogenide based mutlivalue-digital phase change memory element.

The data processing network may further comprise means for programming each unit cells to one the programmed states. The means for programming may comprise a means for applying an electrical signal to the volume of memory material of each unit cell.

FIG. 5 depicts a unit cell including an excitory 18 input and inhibitory 20 input and a data output line 12. This embodiment further includes an Ovonic memory multivalue-digital storage element 14 and an isolation device 16 associated with each of the input lines 18, 20. A unit cell of this type can receive bipolar data which either stimulates or inhibits an output response. In the foregoing unit cells, the Ovonic memory multivalue-digital storage element is programmed by signals applied to the data input lines 10, 18, 20 and the data output lines 12.

FIG. 6 depicts yet another embodiment of the present invention which further includes a field effect transistor 22 having the source and drain in series with a data input line 10 and an Ovonic memory multivalue-digital storage element 14. The gate 24 of the transistor is energized by a separate control line 26. In a unit cell of this type, data impressed on the control line 26 can further modify or supplement data on the input line 10 so as to further influence the setting and resetting of the Ovonic memory multivalue-digital storage element 14.

Figure 7:
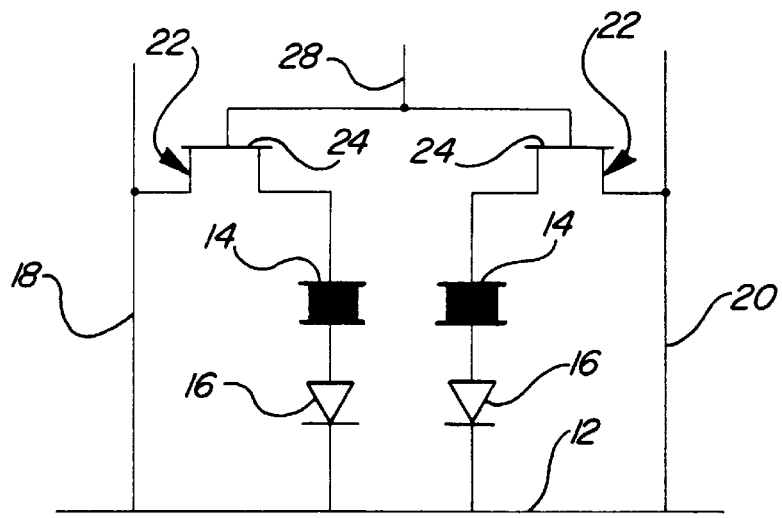
FIG. 7 is a schematic depiction of yet another unit cell of a neural network structure in accordance with the principals of the present invention including excitory and inhibitory lines controlled by a common input line.

Referring now to FIG. 7 there is shown still another embodiment of unit cell. This cell includes excitory 18 and inhibitory lines 20, each having a field effect transistor 22 having the source and drain thereof in series with an Ovonic memory multivalue-digital storage element 14 and an isolation diode 16. The gates 24 of each of the transistors 22 are controlled by a common control line 28. In the operation of a unit cell of this type, the common control line 28 receives input data, such as data from a pixel of an image sensor and communicates this data to the unit cell. Excitory and inhibitory data on the respective lines 18, 20 modifies the cell's response to this data so as to generate an output which is communicated to other cells in the processing net.

It is noted that the parallel processing network of the present invention includes means for a parallel input of a plurality of data. Also, the means for a parallel input of a plurality of data may further include means for sensing a preselected chemical species and generating an electrical signal in response thereto.

Further, the means for a parallel input of a plurality of data may include means for a parallel input of electrical data. As well, the means for a parallel input of a plurality of data may include means for a parallel input of optical data. The means for a parallel input of optical data may include means for converting optical data to electrical data. The means for converting optical data to electrical data may include a photoresponsive body of silicon alloy material.

It is to be understood that the foregoing is illustrative of particular neural network unit cell configurations which may be employed in the present invention. Other variations of unit cell may be similarly employed. The present invention encompasses all parallel distributing processing arrays having interconnected unit cells which include an Ovonic memory multivalue-digital storage element. The present invention readily lends itself to the fabrication of neural network computing systems as well as various other parallel processing devices.

Within the context of the present invention, the volume of memory material is preferably a chalcogenide based material. Chalcogenide based materials include one or more chalcogenide elements therein and it is generally understood that the chalcogenide elements include the group IVa elements of the periodic table. The volume of memory material may include one or more elements from the group consisting of carbon, silicon, germanium, tin, lead, phosphorus, arsenic, antimony, flourine, and bismuth.

Figure 8:
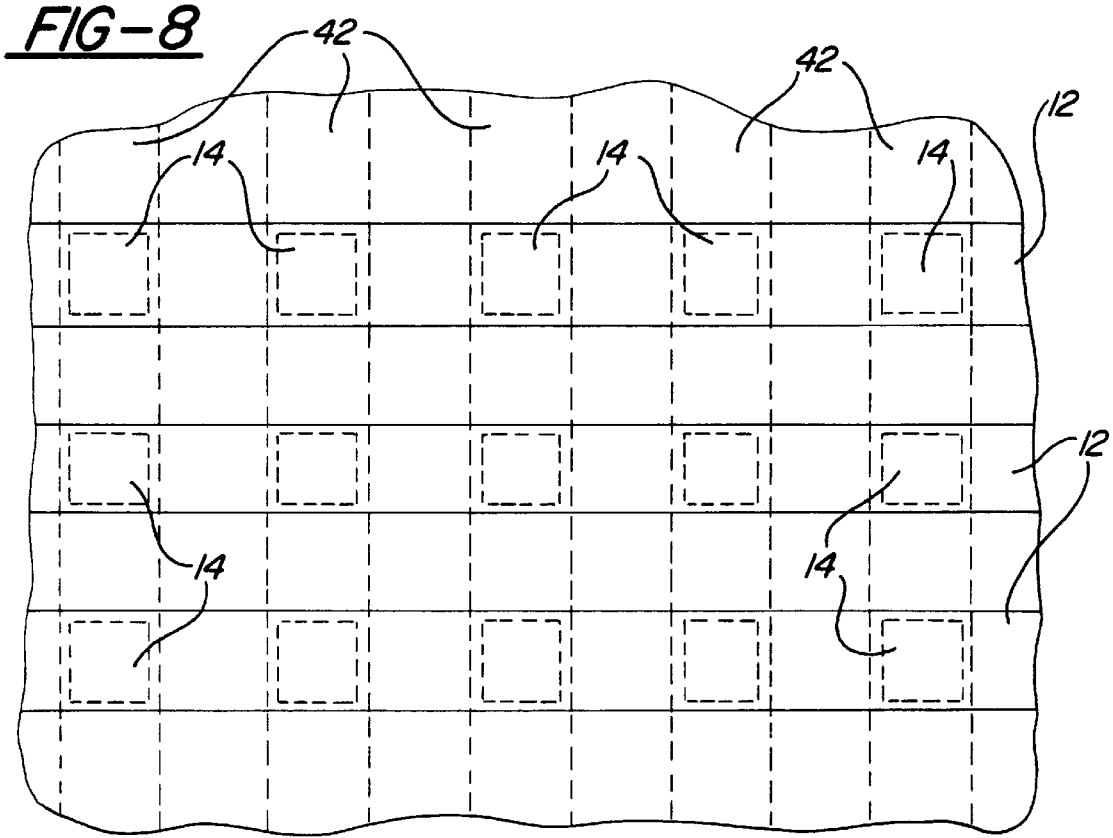
FIG. 8 is the top view of a possible layout of multiple memory elements useful for data storage in accordance with the principals of the present invention and specifically showing how the elements would be connected to a set of X-Y addressing lines.

Another use of the memory elements of the present invention comprises data storage arrays. The top view of a possible configuration for multiple memory element data storage is shown in FIG. 8. As shown, the devices form an X-Y matrix of memory elements. The horizontal strips 12 represent the X set of an X-Y electrode grid for addressing the individual elements. The vertical strips 42 represent the Y set of addressing lines.

Figure 9:
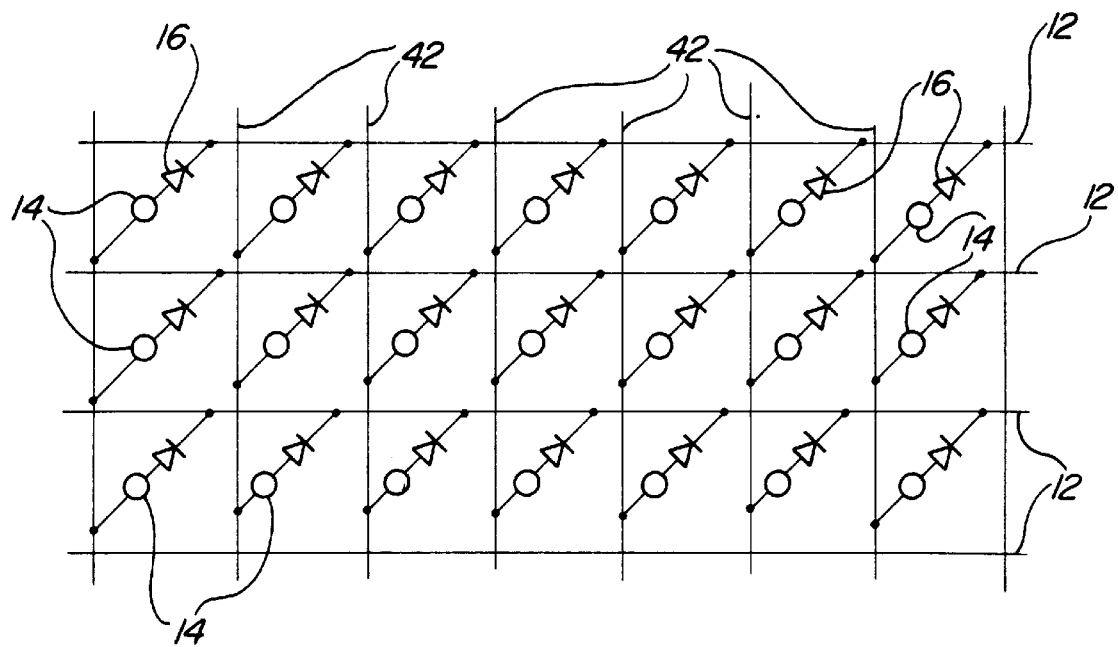
FIG. 9 is a schematic diagram of a matrix of memory elements useful for data storage in accordance with the principals of the present invention and specifically showing how isloation elements such as diodes are connected in series with the memory elements to electrically isolate each of the memory elements from the others.

Each memory element is electrically isolated from the others by using some type of isolation element. FIG. 9, a schematic diagram of the memory device layout, shows how electrical isolation can be accomplished using diodes. The circuit comprises an X-Y grid with the memory elements 14 being electrically interconnected in series with isolation diodes 16. Address lines 12 and 42 are connected to external addressing circuitry in a manner well known to those skilled in the art. The purpose of the isolation elements is to enable each discrete memory elements to be read and written without interfering with information stored in adjacent or remote memory elements of the matrix.

Figure 10:
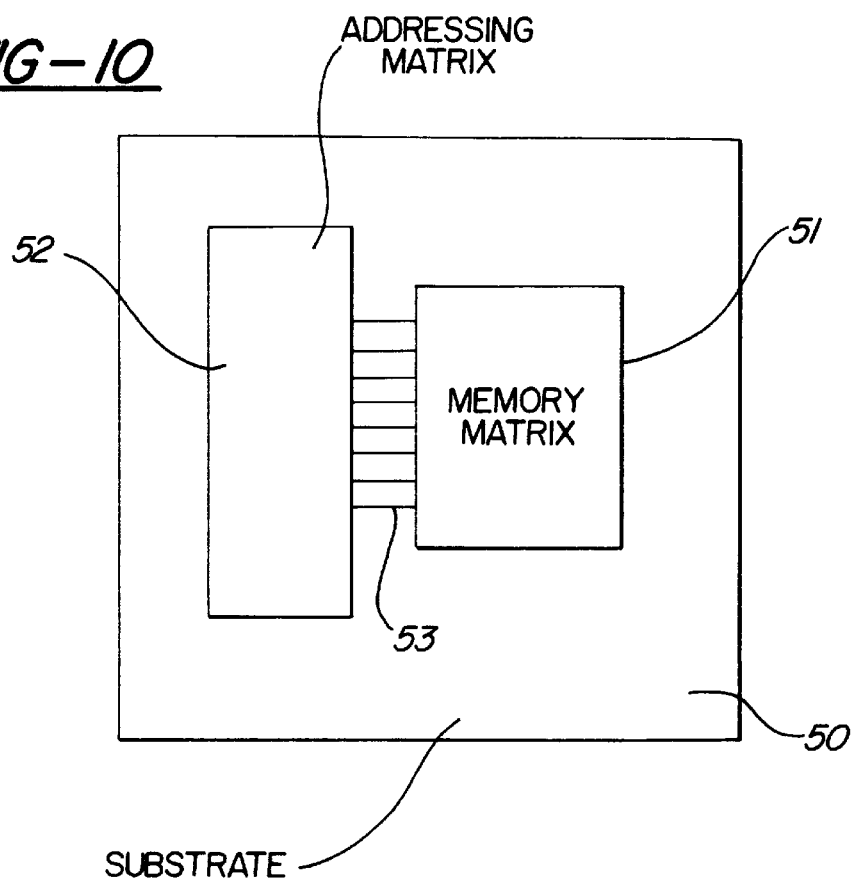
FIG. 10 is a schematic representation illustrating a single crystal semiconductor substrate with an integrated memory matrix according to the principles of the instant invention placed in electrical communication with an integrated circuit chip on which the address drivers/decoders are operatively affixed.

FIG. 10 shows a portion of a single crystal semiconductor substrate 50 with a memory matrix 51 of the present invention formed thereon. Also formed on the same substrate 50 is an addressing matrix 52 which is suitably connected by integrated circuitry connections 53 to the memory matrix 51. The addressing matrix 52 includes signal generating means which define and control the setting and reading pulses applied to the memory matrix 51. Of course, the addressing matrix 52 may be integrated with and formed simultaneously with the solid state memory matrix 51.

As discussed earlier the method of programming of the present invention is applicable to field of cryptography. One of the basic methods of cryptography is the use of an encryption key. The key is used to encrypt and decrypt the transmitted information. The problem with using a key is that if the key is known to a third party, the encrypted information can be decoded by the third party. Today, the best encryption keys are hundreds or thousands of digits long. It is impossible for anyone to memorize such a lengthy number. Therefore the encryption key for data transmitted via the Internet, for example, may be stored on the hard drives of the computers involved in the data transmission. Storage on the hard drive makes the number accessible to anyone gaining access to the computers simply by reading the information directly from the hard drive. Thus the encryption key is easily obtained.

The use of Ovonic memory devices, programmed by the technique described herein, to store encryption keys will eliminate the problem of unauthorized reading of the encryption key. That is, because of the destructive read required to determine the state of each memory element, unless the person trying to read the key programmed into Ovonic memory chip knows the programming pulse width, amplitude, etc used to program the memory elements, he will not be able to reliably read the data stored in the memory element.

For instance, suppose in programming the Ovonic memory element, 8 pulses of 40 nanoseconds were used as the total number of pulses required to switch the device from the high resistance state to the low resistance state. Further suppose that the memory was programmed with 5 pulses, thus requiring 3 more pulses to set the device for a total time still needed of 120 nanoseconds. Now suppose that someone who does not know how the device has been programmed tries to read the programming state of the device. They will not know that the device was programmed using 40 nanosecond pulses. Therefore, when they try to read the device they will not be likely pick the proper programming pulse length. Suppose for example they choose 60 nanosecond programming pulses to try and read the device. They will pulse the device only twice before it switches from the high resistance state to the low resistance state. Therefore even if they knew the total number of programming states, they would get an incorrect result of 6 instead of the programmed 5. Additionally, if the total number of programming states is not known, it will be impossible to know the number from which to subtract the number of pulses required to set the device to the low resistance state.

Therefore it is clear that without knowing the programming parameters for the memory elements, it is impossible to read the programming state of the device.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. A method of programming a digital, multi-level, phase-change memory element comprising a volume of phase-change memory material having at least a high resistance state and a detectably distinct low resistance state, and the ability to be set from said high resistance state to said low resistance state by a set energy pulse, said method comprising the step of:

writing data into said memory element by applying a program energy pulse to said volume of memory material, wherein said program energy pulse is insufficient to set said memory material from said high resistance state to said low resistance state but sufficient to modify said memory material so that accumulation with at least one additional program energy pulse sets said memory material from said high resistance state to said low resistance state.

2. The method of claim 1, further comprising the step of erasing data from said memory element by applying a reset energy pulse to said volume of memory material, wherein said reset energy pulse sufficient to transform said volume of memory material from said low resistance state to said high resistance state.

3. The method of claim 1, further comprising the step of:
   reading data from said memory element by determining whether said memory material is in said low resistance state, and if not;
      applying at least one additional program energy pulse to said volume of memory material sufficient to set said memory material from said high resistance state to said low resistance state; and
      counting said additional energy pulses.

4. The method of claim 1, wherein said energy is electrical energy.

5. The method of claim 4, wherein said electrical energy is electrical current.

6. The method of claim 4, wherein said memory element further comprises means for delivering electrical energy to said volume of memory material.

7. The method of claim 6, wherein said means for delivering is a first contact and a second contact adjoining said volume of memory material.

8. The method of programming of claim 6, wherein said means for delivering comprises at least one tapered contact, said tapered contact tapering to a peak adjoining said volume of memory material.

9. The method of programming of claim 6, wherein said means for delivering comprises at least one field emitter positioned in close proximity to said volume of memory material.

10. The method of programming of claim 6, wherein said means for delivering comprises at least one field emitter positioned within the tunneling distance of said volume of memory material.

11. The method of claim 1, wherein said energy is optical energy.

12. The method of claim 1, wherein said energy is thermal energy.

13. The method of claim 1, wherein said phase-change material includes one or more elements selected from the group consisting of Te, Se, Ge, Sb, Bi, Pb, Sn, As, S, Si, P, O and mixtures or alloys thereof.

14. The method of claim 13, wherein said phase-change material includes at least one chalcogen element and at least one transition metal element.

15. The method of programming of claim 14, wherein said chalcogen element is selected from the group of Te, Se and mixtures or alloys thereof.

16. The method of programming of claim 15, wherein said chalcogen element is a mixture of both Te and Se.

17. The method of programming of claim 16, wherein said at least one transition metal element is selected from the group consisting of Cr, Fe, Ni, Nb, Pd, Pt and mixtures or alloys thereof.

18. A method of setting a volume of phase-change memory material from a high resistance state to a detectably distinct low resistance state, said method comprising the step of:
   applying a plurality of program energy pulses to said volume of memory material, wherein each of said program energy pulses is insufficient to set said memory material from said high resistance state to said low resistance state but sufficient to modify said material so that the accumulation of said plurality of program energy pulses causes said memory material to be set from said high resistance state to said low resistance state.

19. The method of claim 18, wherein said plurality of program energy pulses is electrical energy.

20. The method of claim 19, wherein said electrical energy is electrical current.

21. The method of claim 18, wherein said energy is optical energy.

22. The method of claim 18, wherein said energy is thermal energy.

23. A method of programming a digital, multi-state, phase-change memory element comprising a volume of phase-change memory material having at least a high resistance state and a detectably distinct low resistance state, and the ability to be set from said high resistance state to said low resistance state by a set current pulse having a set amplitude and a set duration, said method comprising the step of:
   writing data into said memory element by applying one or more program current pulses to said volume of memory material, wherein each of said program current pulses has amplitude equal to said set amplitude, each of said program current pulses having duration insufficient to switch said memory material from said high resistance state to said low resistance state, said one or more program current pulses having integrated duration less than or equal to said set duration.

24. The method of claim 23, further including the step of reading data from said memory element, said reading step comprising the steps of:
   determing whether said volume of memory material is set to said low resistance state; and if not
   applying one or more additional program current pulses to said memory material until said memory material is set from said high resistance state to said low resistance state; and
   counting said additional program current pulses.

25. The method of claim 23, further including the step of erasing data from said memory element, said erasing step comprising the steps of:
   applying a reset current pulse to said volume of memory material, said reset current pulse sufficient to transform said memory material from said low resistance state to said high resistance state.

26. A parallel processing network comprising:
   (A) means for a parallel input of a plurality of data; and
   (B) parallel distributed processing means operative to receive and process said parallel input of said plurality of data, said processing means including:
      (1) a three-dimensional array of stacked planes of a plurality of unit cells; each of said unit cells is a single repetition of a repetitive, three-dimensional electrically interconnected pattern; each unit cell including:
         (a) data input means;
         (b) data output means; and
         (c) a multivalue-digital phase change memory element disposed so as to establish communication between said data input means and said data output means, said memory element including a chalcogenide based volume of memory material having a high resistance state and a detectably distinct low resistance state and the ability to be set from said high resistance state to said low resistance state by a set current pulse having sufficient energy, said memory material programmable to one of a plurality of detectably distinct programmed states by one or more program current pulses, each of said program current pulses insufficient to set said memory element but sufficient to modify said memory material so that accumulation with at least one additional program current pulse sets said memory element; and (2) means for establishing communication between said data input means of a first one of said unit cells in a first one of said stacked planes and said data output means of a second one of said unit cells in a second one of said stacked planes, said communication occurring through said volume of memory material of at least one of said unit cells, whereby the connection between said input means and said output means is determined by the programmed state of said memory material.

27. The network of claim 26, further comprising means for programming each of said plurality of unit cells to one of said programmmed states.

28. The network of claim 27, wherein said means for programming comprises means for applying an electrical signal to said volume of memory material of each of said plurality of unit cells.

29. The network of claim 28, wherein said means for applying is in electrical communication with the data input means of the corresponding unit cell.

30. The network of claim 28, wherein said means for applying is in electrical communication with the data output means of at least one other unit cell.

31. The network of claim 27, wherein said means for programming includes a field effect transistor.

32. The network of claim 31, wherein the gate of said field effect transistor is in electrical communication with the data output means of at least one other unit cell.

33. The network of claim 26, wherein each of said plurality of unit cells further includes isolation means disposed in series with said volume of memory material.

34. The network of claim 33, wherein said isolation means is a diode.

35. The network of claim 34, wherein said diode is a polycrystalline silicon diode.

36. The network of claim 34, wherein said diode is a microcrystalline diode.

37. The network of claim 26, wherein said isolation means comprises a transistor.

38. The network of claim 37, wherein said transistor is a field effect transistor.

39. The network of claim 26, wherein said means for a parallel input of a plurality of data comprises means for a parallel input of electrical data.

40. The network of claim 26, wherein said means for a parallel input of a plurality of data comprises means for a parallel input of optical data.

41. The network of claim 40, wherein the means for a parallel input of optical data further includes means for converting optical data to electrical data.

42. The network of claim 41, wherein said means for converting optical data to electrical data includes a photo-responsive body of silicon alloy material.

43. The network of claim 26, wherein said means for a parallel input of data further includes means for sensing a preselected chemical species and generating an electrical signal in response thereto.

44. The network of claim 26, wherein said chalcogenide based volume of memory material further includes one or more elements from the group consisting of carbon, silicon, germanium, tin, lead, phosphorus, arsenic, antimony, fluorine, and bismuth.

45. The network of claim 26, wherein said data input means is an excitory data input means and wherein said each unit cell further includes second data input means for the input of inhibitory data and a second chalcogenide based multivalue-digital phase change memory element, disposed so as to establish communication between said second data input means and said data output means.

* * * * *